United States Patent
Sartschev et al.

(10) Patent No.: US 6,771,061 B2
(45) Date of Patent: Aug. 3, 2004

(54) HIGH SPEED TESTER WITH NARROW OUTPUT PULSES

(75) Inventors: Ronald A. Sartschev, Dunstable, MA (US); Jun Xu, Nashua, NH (US)

(73) Assignee: Teradyne, Inc., Boston, MA (US)

( * ) Notice: Subject to any disclaimer, the term of this patent is extended or adjusted under 35 U.S.C. 154(b) by 15 days.

(21) Appl. No.: 10/245,534

(22) Filed: Sep. 17, 2002

(65) Prior Publication Data

US 2004/0051518 A1 Mar. 18, 2004

(51) Int. Cl.[7] .............................................. G01R 31/26
(52) U.S. Cl. ................. 324/158.1; 324/765; 324/76.47; 327/176; 327/291; 714/724
(58) Field of Search .................. 324/73.1, 76.47, 324/76.82, 759, 763, 765, 158.1; 327/26, 31, 100, 173, 176, 199, 217, 291; 714/743, 724

(56) References Cited

U.S. PATENT DOCUMENTS

| | | | | |
|---|---|---|---|---|
| 5,003,194 A | * | 3/1991 | Engelhard | 327/176 |
| 5,258,968 A | * | 11/1993 | Matsuda et al. | 369/44.35 |
| 5,293,079 A | * | 3/1994 | Knoch | 327/31 |
| 5,321,700 A | | 6/1994 | Brown et al. | 714/743 |
| 6,291,981 B1 | | 9/2001 | Sartschev | 324/76.82 |

OTHER PUBLICATIONS

Sailesh R. Maskai, et al., "Synthesis Techniques for CMOS Folded Source-Coupled Logic Circuits", Aug. 8, 1992.

* cited by examiner

Primary Examiner—Minh N. Tang
(74) Attorney, Agent, or Firm—Lance Kreisman; Teradyne Legal Dept.

(57) ABSTRACT

A tester that is well suited for operation at high speeds or with narrow pulses. The tester includes a state based pulse shaping circuit that combines edge signals into a pulsed output signal. The circuit combines groups of set and reset signals. The edge signals define the start and stop of pulses in the output signal even if the set and reset edge signals overlap or successive set signals overlap or successive reset signals overlap. This circuit allows for a low cost and low power CMOS implementation of an output signal formatter.

20 Claims, 6 Drawing Sheets

HIGH SPEED TESTER WITH NARROW OUTPUT PULSES

CROSS-REFERENCES TO RELATED APPLICATIONS

Not Applicable.

STATEMENT REGARDING FEDERALLY SPONSORED RESEARCH OR DEVELOPMENT

Not Applicable.

REFERENCE TO MICROFICHE APPENDIX

Not Applicable.

BACKGROUND OF THE INVENTION

1. Field of the Invention

This invention relates generally to automatic test equipment for testing electronic devices and more particularly to testing devices that operate with high speed digital signals.

2. Description of Related Art

Automatic test equipment is widely used to test semiconductor components during their manufacture. The automatic test equipment generates stimulus signals and measures responses from a device under test. The responses are compared to the expected responses from a fully functioning chip to determine whether the device under test is fully functional.

The automatic test equipment is programmed with a pattern that represents the stimulus and expected data for a device under test. Different kinds of devices under test will require different patterns for testing. Thus, the automatic test equipment must be flexible enough to generate a wide range of signals that are compatible with the types of signals many types of chips generate or receive.

FIG. 1 shows a prior art test system in simplified block diagram form. The system includes a tester body 110 and a computer work station 112 that controls the operation of the tester body and provides a user interface.

Within tester body 110, there are multiple copies of circuitry called a channel 114. Each channel 114 generates or measures a signal on one lead of a device under test. A channel 114 includes a pattern generator 120, a timing generator 122 a failure processor 124, a formatter 126, a driver 128 and a comparator 130.

Pattern generator 120 stores the pattern that defines the data that is to be applied or is expected during each cycle of tester operation. The data specifies whether the tester is to drive data or measure data during that cycle. The pattern also includes information specifying the data value, such as a logic 1 or a logic 0.

Additionally, the format of the signal must be specified. For example, some semiconductor devices represent a logical 1 by having a signal line at a high voltage during an entire cycle. Other chips represent a logical 1 by changing the voltage on a signal line during a cycle. Still others represent a logical 1 by a voltage pulse on a line during the cycle. Further, where a voltage transition during the cycle is used to represent a signal, the time at which that transition occurs might be different for different chips under test.

Modern testers are sufficiently flexible that they can be programmed for almost any signal format. To achieve this flexibility, the tester includes a timing generator 122. The timing generator generates what are known as "edge" signals. These are signals that change state at a time that can be programmed into the timing generator.

The edge signals are combined by a formatter 126 to produce an output signal of the desired shape. For example, to create a pulse that starts 0.5 nsec after the start of a cycle and has a width of 1 nsec, one of the edge signals would be programmed to occur 0.500 nsec after the start of the cycle. Another edge signal would be programmed to occur at 1.5 nsec after the start of the cycle. The formatter would combine these signals to create the desired signal to be applied to driver 128. Driver 128 produces the signal that is applied to the device under test.

More specifically, formatter 126 uses the first edge to define when driver 128 is turned on and the second edge to define when driver 128 is turned off. Traditionally, the circuit that combines the edges is an S-R flip-flop. An S-R flip-flop has a Set input and a Reset input. While a logic high signal is applied to the Set input, the output of the flip-flop is high. While a logic high is applied to the Reset input, the output of the flip-flop is low. While both the Set and Reset inputs are low, the S-R flip-flop holds its state.

In a tester, the data in the pattern generator 120 controls which edges are applied to the flip flop in each cycle. For example, in a cycle in which the channel 114 should output a signal that is goes high at 0.5 nsec and low at 1.5 nsec, the tester will gate an edge to the S input of the flip flop that goes high at 0.5 nsec. Separately, an edge that goes high at 1.5 nsec is gated to the R input of the flip flop.

Because there are multiple edge signals that can all be programmed to occur at different times, the tester can be programmed to generate nearly any type of waveform. Limitations arise, though, when it is desired to generate a very fast signal because such signals have short periods (i.e. narrow pulse widths).

Timing generator 122 is limited in how narrow a pulse it can generate for an edge signal. If the width of a set signal from timing generator 122 is wider than the desired width of the output pulse to be generated by tester 110, that means that the Reset signal will be asserted before the end of the Set signal. In other words, both the Set and Reset inputs to the S-R flip-flop will be asserted simultaneously. A conventional S-R flip-flop does not have a determinate output state when both the Set and Reset inputs are asserted. Therefore, we have recognized the need for a unique S-R flip-flop that can respond appropriately to having both its Set and Reset inputs asserted simultaneously. We will describe this unique S-R flip-flop as an SRM flip-flop below.

Even with our inventive flip-flop circuit that allows both the Set and Reset inputs to be asserted simultaneously, we have identified a second limitation in generating high frequency signals. When using a conventional format circuit consecutive output pulses can not occur at an interval narrower than the width of the edge signals. Otherwise, the Set signal used to define the beginning of one output pulse will still be asserted when it is time to assert the Set signal to define the beginning of the next pulse.

In part, we have avoided this second limitation by generating multiple groups of edge signals. Each group of edge signals can be used to define a pulse. For example, there might be "Odd" Set and Reset signals and "Even" Set and Reset signals. The odd signals would be used to define the beginning and end of output pulses 1, 3, 5 . . . . The even signals would be used to define the beginning and end of output pulses 2, 4, 6 . . . . Such an approach is sometimes called interleaving or multiplexing the edges.

U.S. Pat. No. 5,321,700 to Brown et al. is an example of an interleaved tester, and is hereby incorporated by reference. However, using different edge signals to generate successive output pulses does not avoid the limitation that a subsequent Set signal can not occur until the first Set signal is no longer asserted. As will be described below, we have invented a way to generate successive output pulses that are spaced apart by an interval shorter than the duration of a Set signal.

BRIEF SUMMARY OF THE INVENTION

With the foregoing background in mind, it is an object of the invention to provide an automatic test system that operates at high data rates.

To achieve the foregoing object, as well as other objectives and advantages, the tester is provided with a plurality of edge groups that can be used to generate successive output signals. The formatter is constructed with state based pulse shaping circuitry that outputs a pulse that has a duration determined by the time between the rising edge of a set signal and the rising edge of a reset signal. The state based pulse shaping circuitry operates even if the Set signals and Reset signals overlap or if the Set or Reset signals in different edge groups overlap.

BRIEF DESCRIPTION OF THE DRAWINGS

Additional objects, advantages, and novel features of the invention will become apparent from a consideration of the ensuing description and drawings, in which—

DETAILED DESCRIPTION OF THE PREFERRED EMBODIMENT

Figure 2:
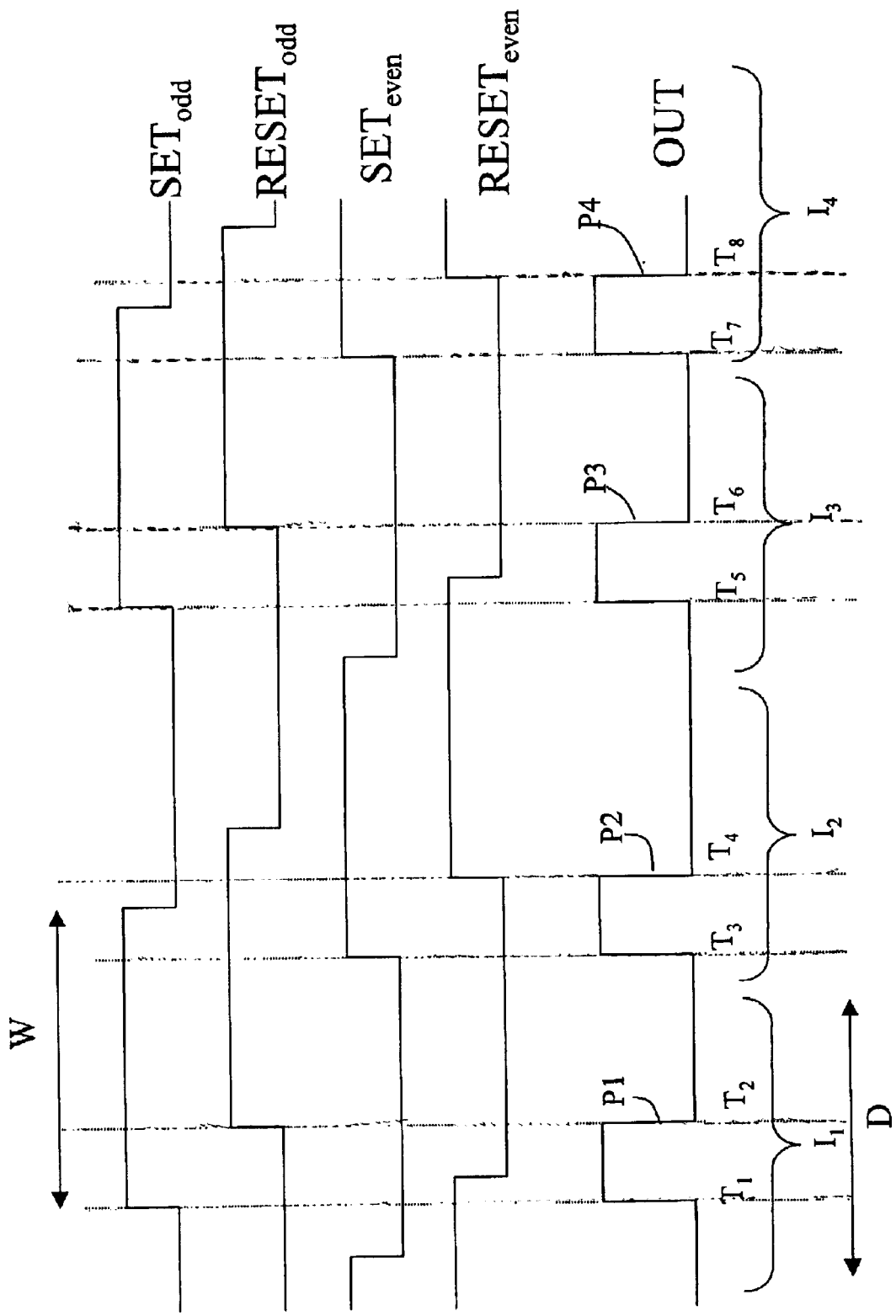
FIG. 2 is a timing diagram showing the desired operation of the format circuit according to the invention.

FIG. 2 shows the desired operation of a format circuit. In the illustrated embodiment, there are two groups of edge signals, which are termed the "Odd" group and the "Even" group. FIG. 2 shows the $SET_{even}$, $RESET_{even}$, $SET_{odd}$ and $RESET_{odd}$ signals. The desired output pulse train is identified as the signal OUT.

It is desired that when the $SET_{odd}$ signal is asserted that an output pulse begins. Pulse P1 therefore starts at time $T_1$, when the $SET_{odd}$ signal is asserted. Pulse P1 lasts until time $T_2$, when the $RESET_{odd}$ signal is asserted. Notice that a pulse of the desired width is created despite the fact that the $SET_{odd}$ and $RESET_{odd}$ signals overlap.

It is also desired that a tester be able to produce a subsequent pulse quickly possibly even before the $SET_{odd}$ signal is de-asserted. In FIG. 2, pulse P2 is shown starting at time $T_3$. This time coincides with the assertion of the $SET_{even}$ signal, which occurs even before the $SET_{odd}$ signal is de-asserted.

Pulse P2 is shown to last until time $T_4$, when the $RESET_{even}$ is asserted. The desired output is produced even though the $RESET_{even}$ signal overlaps the $SET_{even}$ signal. In a preferred embodiment, the same output would be produced even if the $RESET_{even}$ signal overlaps the $SET_{odd}$ signal.

Figure 1:
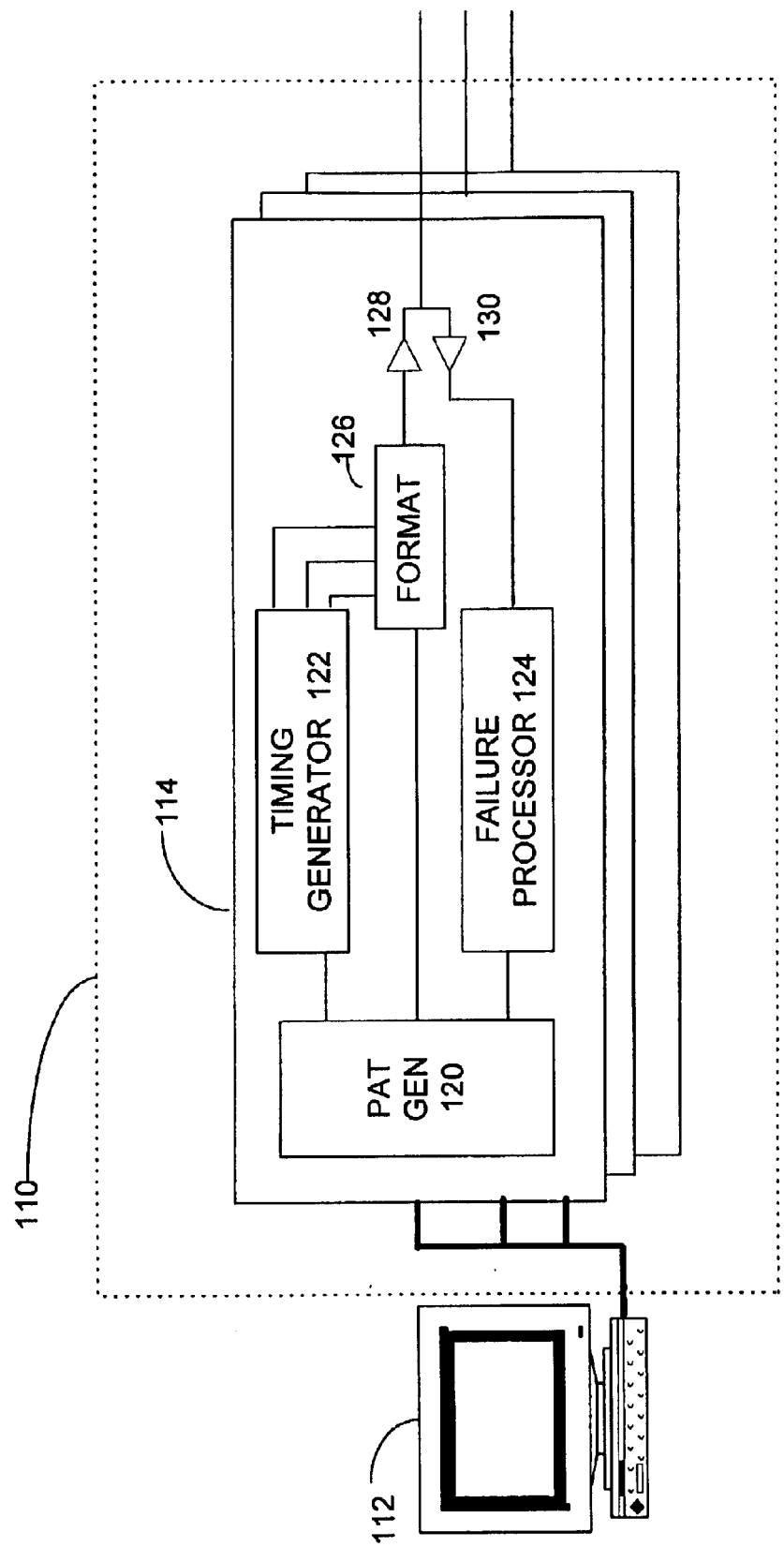
FIG. 1 is a simplified block diagram of a prior art test system.

Subsequent pulses are produced in the output pulse train in the same fashion. Pulses P3 and P4 are shown. It should be appreciated that the four pulses are shown in a periodic fashion. The number of pulses is shown for illustration only. Any number of pulses might be created in this fashion. In addition, it is not necessary that the pulses all be of the same width or that the pulses occur at periodic intervals. All of these factors are determined by the times at which the $SET_{even}$, $RESET_{even}$, $SET_{odd}$ and $RESET_{odd}$ signals are asserted. In a tester, such as the tester of FIG. 1, these signals are preferably derived from edge signals generated by a timing generator, such as 122. The times of these signals is therefore preferably programmable.

In FIG. 2, time is shown divided up in successive intervals denoted $I_1$, $I_2$, $I_3$, $I_4$ . . . . Many testers are programmed to generate or measure test signals during periodic intervals. Often, the length of these periodic intervals is programmed to match the clock speed of a particular device under test. Therefore, the test pattern specifies a different set of test signals to drive or expect from a device under test in each interval.

Preferably, a tester will be able to generate a different timing signal during each interval. In FIG. 2, each of the intervals $I_1$, $I_2$, $I_3$, $I_4$ . . . has a duration, D. However, it should be noted that each of the $SET_{even}$, $RESET_{even}$, $SET_{odd}$ and $RESET_{odd}$ signals has a width W, which is longer the interval D. If W represents the minimum width of an edge signal that can be accurately generated by timing generator, a conventional tester would therefore be unable to generate a timing pattern as shown in FIG. 2 because the Set and Reset signals overlap as do the successive set signals and successive reset signals.

Figure 3:
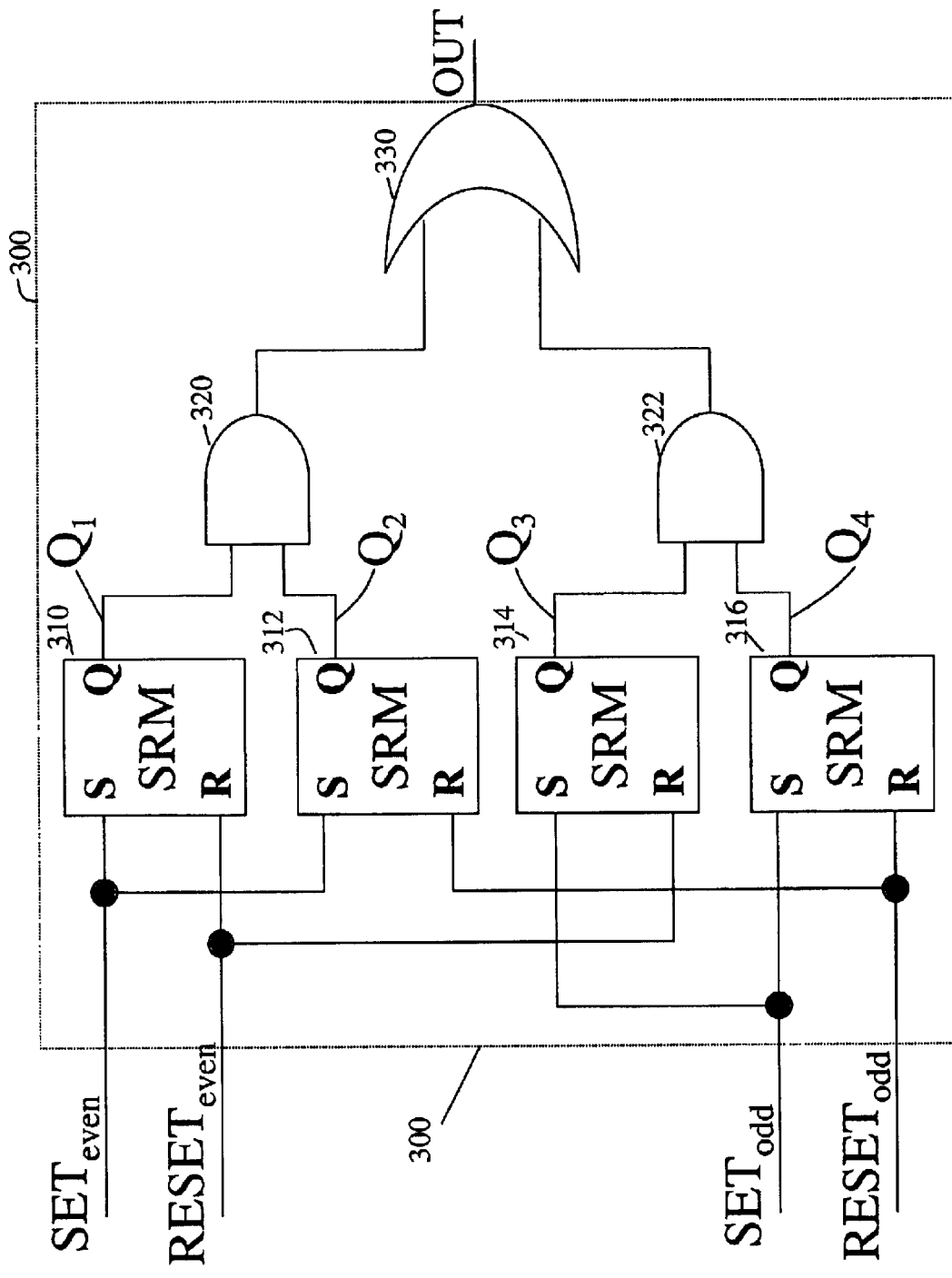
FIG. 3 is a simplified block diagram according to the invention.

Turning now to FIG. 3, an embodiment of a state based pulse shaping circuit 300 is shown. Circuit 300 produces the output pulse stream illustrated in FIG. 2 in response to the input signals. The circuit accepts as inputs groups of edge signals. In the illustrated embodiment two groups are illustrated: $SET_{even}$, and $RESET_{even}$ form one group and $SET_{odd}$ and $RESET_{odd}$ form the second group.

Each group contains a set and a reset signal. One set signal and one reset signal from each group is routed to one of the S-R flip-flops with memory 310, 312, 314 or 316. In the illustrated embodiment, there are two groups of edge signals. Therefore, there are four possible combinations of set and reset signals that can be formed. Thus, the example shows four S-R flip-flops with memory.

An implementation of the S-R flip-flops with memory 310, 312, 314 or 316 is described in U.S. Pat. No. 6,291,981 issued to Sartschev on Sep. 18, 2001, which is hereby incorporated by reference. Each S-R flip-flop with memory accepts a set and a reset input. It outputs a pulse that starts when the set input is asserted and ends when the reset input is asserted. It operates in this fashion even if the set signal overlaps the reset signal or the reset signal overlaps the set signal. The flip-flop is said to have "memory" because its operation is dependent on the order in which the set and reset signals are asserted.

Figure 4:
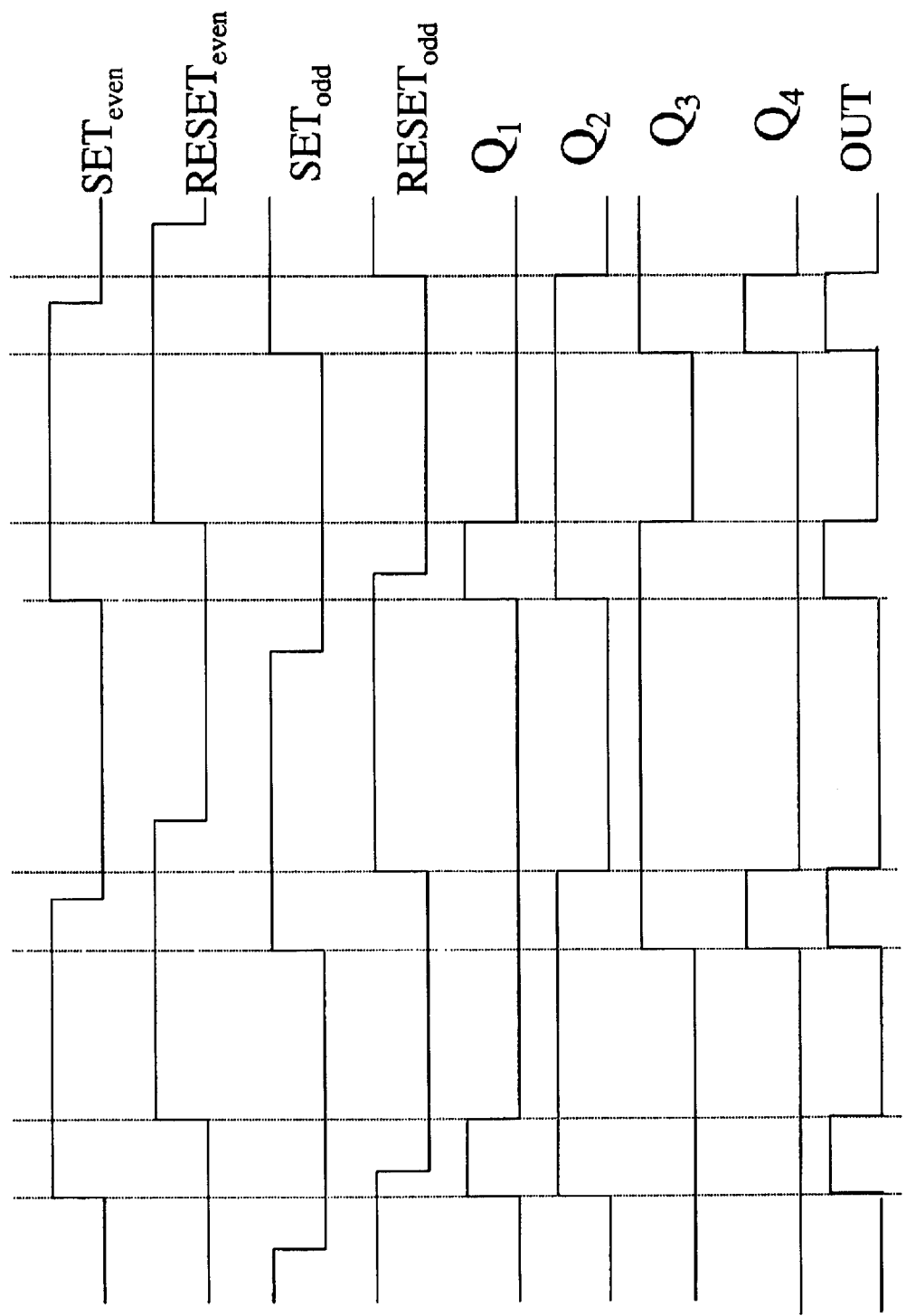
FIG. 4 is a timing diagram useful in understanding the operation of the circuit of FIG. 3.

The outputs of each of the S-R flip-flops with memory 310, 312, 314 or 316 is denoted $Q_1$, $Q_2$, $Q_3$ and $Q_4$, respectively. Signal $Q_1$ represents a pulse that starts in response to $SET_{even}$ and ends in response to the $RESET_{even}$ signal. Signal $Q_2$ represents a pulse that starts in response to $SET_{even}$ and ends in response to the $RESET_{odd}$ signal. For the example edge signals in FIG. 2, the resulting signals $Q_1$ and $Q_2$ are shown in FIG. 4.

Signal $Q_3$ represents a pulse that starts in response to $SET_{odd}$ and ends in response to the $RESET_{even}$ signal. Signal $Q_4$ represents a pulse that starts in response to $SET_{odd}$ and ends in response to the RESET$_{odd}$ signal. For the example edge signals in FIG. 2, the resulting signals Q$_3$ and Q$_4$ are shown in FIG. 4.

The signals Q$_1$ and Q$_2$ are combined in AND gate 320. Accordingly, the output of AND gate 320 is a pulse that starts in response to a SET$_{even}$ signal being asserted and ends when a reset signal in any of the groups of edge signals is asserted.

The signals Q$_3$ and Q$_4$ are combined in AND gate 322. Accordingly, the output of AND gate 322 is a pulse that starts in response to a SET$_{odd}$ signal being asserted and ends when a reset signal in any of the groups of edge signals is asserted.

The outputs of the AND gates 320 and 322 are combined in OR gate 330. Thus, the output of circuit 300 is a stream of pulses that begin in response to the set signal in any of the input groups and end in response to the reset signal in any of the groups. This result is achieved even if the set and reset signals overlap or if successive set signals overlap.

Figure 5A:
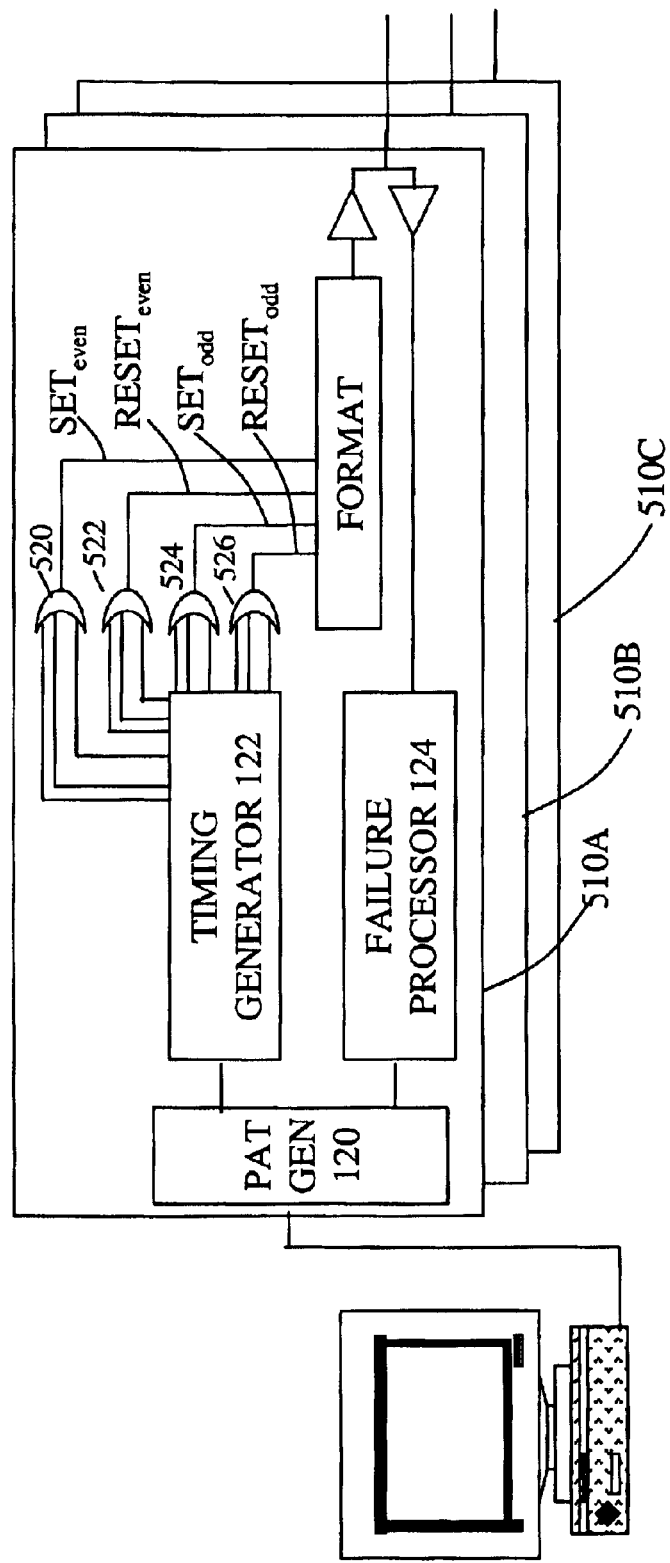
FIGS. 5A and 5B are alternative embodiments illustrating the generation of groups of edge signals.

Turning now to FIG. 5, various ways that the groups of edge signals might be generated in a tester are illustrated. In FIG. 5A, an odd and even group of edge signals are shown. All of the edge signals are shown generated by a timing generator 122 in a single channel of a tester. As is conventional, each timing generator has a plurality of edge generators, which are individually programmable. In the illustrated embodiment, a plurality of the edge generators are used to generate each of the set and reset signals in each group. OR gate 520 combines several edge signals into a SET$_{even}$ signal. OR gate 522 combines several edge signals into RESET$_{even}$ signal. OR gate 524 combines several edge signals into SET$_{odd}$ signal. OR gate 526 combines several edge signals into RESET$_{odd}$ signal. Combining signals in this fashion allows much greater flexibility in programming a tester. Each edge signal might be dedicated to signal a particular type of event, more than one of which might signal the transition in an output pulse.

Figure 5B:
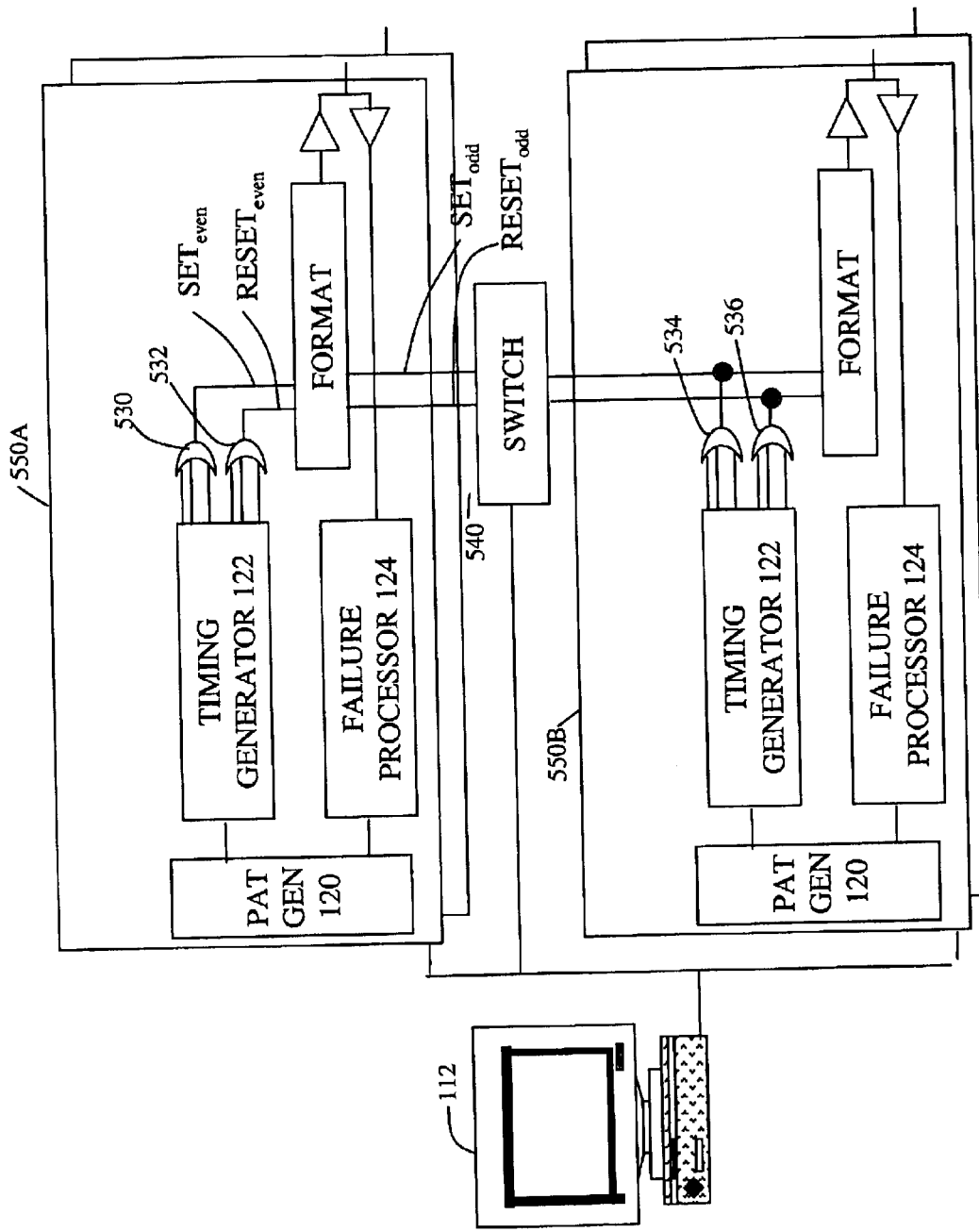

FIG. 5B shows an alternative tester implementation. In this implementation, tester channels are paired. Two channels 550A and 550B are shown. Each channel generates one group of a set and reset signal. In channel 550A, OR gate 530 combines several edge signals into a SET$_{even}$ signal. OR gate 532 combines several edge signals into RESET$_{even}$ signal. In channel 550B, OR gate 534 combines several edge signals into SET$_{odd}$ signal. OR gate 536 combines several edge signals into RESET$_{odd}$ signal. Switch 540 routes the signals from channel 550B to the formatter in channel 550A so that two groups are edge signals are available at the same formatter, which contains circuit 300.

Switch 540 is controlled by work station 112, which can be programmed to operate the tester in many different states. Thus, a tester that can be flexibly programmed is provided. The test system shown in FIG. 5B can be operated to provide two independent signals from channels 550A and 550B. Or, the edge signals from channel 550B can be routed to channel 550A to provide an output signal from channel 550A that has twice as many output pulses. In this way, the data rate in channel 550A can be effectively doubled.

It should be appreciated that the tester of FIG. 5B contains multiple pairs of channels so that multiple test signals can be generated.

In a preferred embodiment, circuit 300 is implemented as part of a CMOS chip. Likely, it will be integrated into an ASIC chip that includes the formatter 126. Further, this approach is particularly valuable for implementing a tester that operates at a data rate of 800 MHz or more. Such a tester would require pulses with a width of 1.2 nanoseconds or less. Accurately making pulses of that width would be extremely difficult. The circuitry necessary to implement such a design would also have a relatively large area and consume a relatively large amount of power. In a preferred embodiment, the tester operates at 1 GHz or more, meaning the pulses have a width of less than 1 nanosecond.

Further, FIG. 5 shows that each SET and RESET signal is made by combining multiple edge signals. Possibly, the edge signals could correlate to different events. Or, edge signals that are out of phase might be combined to create an output with a higher frequency than any of the edge signals—allowing edge generators to operate at a lower frequency, simplifying their construction.

Alternatives

Having described one embodiment, numerous alternative embodiments or variations can be made.

While the invention has been particularly shown and described with reference to the preferred embodiments thereof, it will be understood by those skilled in the art that various changes in form and detail may be made therein without departing from the spirit and scope of the invention.

Throughout, reference has been made to successive output signals. It should be appreciated that this reference indicates the time at which an output pulse could occur. Whether a pulse physically appears at that time depends in part on the data value that the pattern generator 120 indicates should occur in that interval and the format that is being used to represent that data value. For example, some output formats have a 0V signal when a logical 0 is to be represented and a 1.3V signal when a logic 1 is to be represented. If pattern generator 120 indicates a logic 0 is to be represented at a particular time, even though the Set and Reset signals are generated as described above, the output of the tester channel will remain at 0V.

Also, it should be appreciated that operation of the invention is described in relation to the overlap of successive Set signals. The same problem occurs when successive Reset signals overlap. Overlap of Set signal has been described for simplicity of illustration and not as a limitation on the invention.

Further, output pulses are described herein as being used to control the time when a test signal is applied to a device under test. However, one of skill in the art should appreciate that once a pulse signal is generated, it could also control the time at which an signal being output by the device under test is read.

In the illustrated embodiment, either of the set signals may specify the start of a pulse and either of the reset signals may specify the end of that pulse. This allows a tester to be operated with pulses that span multiple intervals such as I$_1$, I$_2$, I$_3$, I$_4$ ... shown in FIG. 2. However, if it were acceptable to have pulses that were only as long as a single interval, then circuit 300 might be simplified by eliminating flip-flops 312 and 314 along with AND gates 320 and 322.

Furthermore, a specific circuit has been illustrated to show the generation of a output pulses. This circuit represents the preferred embodiment because it can readily be implemented on a semiconductor chip, particularly a CMOS chip. Thus, it lends itself to relatively low cost, low power implementation. However, it is possible that other systems implementing the invention could be used.

What is claimed is:

1. An automatic test system for semiconductor devices, the automatic test system having a plurality of channel circuits generating test signals, each channel having a timing generator and a format circuit, wherein:

a) each timing generator generates a plurality of edge signals, each edge signal having a duration of at least W, b) the edge signals are combined into at least four groups, with signals in at least two of the groups indicating the start of a pulse created by the format circuit and signals in at least two of the groups indicating the end of a pulse created by the format circuit;

c) the format circuit has at least four inputs, each coupled to one of the groups, and an output signal, with pulses in the output occurring at an interval that is shorter than the duration W.

2. The automatic test system of claim 1 wherein the interval between pulses is less than 1.2 nanoseconds.

3. The automatic test system of claim 1 wherein the interval between pulses is less than 1 nanosecond.

4. The automatic test system of claim 2 wherein the format circuit is implemented as part of a CMOS chip.

5. The automatic test system of claim 1 wherein the timing generator in each channel generates the at least 4 groups of edge signals.

6. The automatic test system of claim 1 wherein edge signals in separate channels are combined to form the at least four groups.

7. The automatic test system of claim 6 additionally comprising a circuit switchably connecting edge signals generated in one channel to a format circuit in a different channel.

8. The automatic test system of claim 1 wherein the format circuit contains a pulse shaping circuit comprising:

a collection of sub-circuits, each sub-circuit having as inputs one of the groups of signals indicating the start of a pulse and one of the groups of signals indicating the end of a pulse.

9. The automatic test system of claim 8 wherein each of the sub-circuits is a set-reset flip-flop with memory.

10. The automatic test system of claim 8 wherein there is one sub-circuit for each pair of signals that can be formed from the at least four groups.

11. The automatic test system of claim 10 wherein each of the sub-circuits has an output and the outputs of each of the sub-circuits having an input connected to the same group of signals defining the start of a pulse are logically ANDed to create an intermediate output.

12. The automatic test system of claim 11 wherein the intermediate outputs associated with each of the groups of signals defining the start of a pulse are logically ORed to create a series of pulses.

13. The automatic test system of claim 1 used in the method of manufacturing a semiconductor device, wherein the output of the format circuit is used to create a test signal applied to a semiconductor device under test and the response to the test signal is used in further processing the semiconductor device before shipment to a customer.

14. The automatic test system of claim 1 wherein each of the at least four groups of edge signals is formed by creating the logic OR of a subset of the edge signals generated by the timing generator.

15. An automatic test system for semiconductor devices, the automatic test system having a plurality of channel circuits generating test signals, each channel having a timing generator generating a plurality of edge signals, the system further comprising:

a state based pulse shaping circuit having as an input a plurality of groups of edge signals, with at least two of the groups defining the start of an output pulse and at least two of the groups defining the end of an output pulse, wherein the state based pulse shaping circuit produces an output pulse stream having pulses starting at the times indicated by the signals in the groups defining the start of a pulse and ending at the times indicated by the signals in the group defining the end of a pulse, wherein the state based pulse shaping circuit produces such a pulse stream when signals defining the start of a pulse have a pulse width that is longer than the width of the output pulse and longer than the spacing between successive pulses in the output pulse train.

16. The automatic test system of claim 15 wherein the interval between pulses is less than 1 nanosecond.

17. The automatic test system of claim 15 wherein the state based pulse shaping circuit is implemented as part of a CMOS chip.

18. The automatic test system of claim 15 wherein each of the groups defining the start and end of an output pulse is formed by combining a plurality of edge signals generated by timing generators in the plurality of channels.

19. The automatic test system of claim 18 additionally comprising a plurality of switching circuits, switchably coupling edge signals from certain channels to other channels.

20. The automatic test system of claim 15 used in the method of manufacturing semiconductor devices, the method comprising:

a) operating the test system to provide test signals to a device under test at a periodic rate in excess of 800 MHz, thereby creating predetermined periods;

b) using one of the at least two groups defining the start of an output pulse and one of the at least two groups defining the end of an output pulse to generate an output pulse in a first period; and c) using a different one of the at least two groups defining the start of an output pulse and a different one of the at least two groups defining the end of an output pulse to generate an output pulse in a second period, immediately following the first period.

* * * * *